(12) United States Patent
Kishimoto et al.

(10) Patent No.: US 10,627,707 B2
(45) Date of Patent: Apr. 21, 2020

(54) PROJECTOR FOR REDUCING MECHANICAL STRESS OF AN OPTICAL PANEL DUE TO VIBRATION

(71) Applicant: SONY CORPORATION, Tokyo (JP)

(72) Inventors: Gota Kishimoto, Tokyo (JP); Takashi Kato, Tokyo (JP); Miki Tsuchiya, Tokyo (JP)

(73) Assignee: SONY CORPORATION, Tokyo (JP)

( * ) Notice: Subject to any disclaimer, the term of this patent is extended or adjusted under 35 U.S.C. 154(b) by 1 day.

(21) Appl. No.: 15/779,748

(22) PCT Filed: Oct. 21, 2016

(86) PCT No.: PCT/JP2016/081375
§ 371 (c)(1),
(2) Date: May 29, 2018

(87) PCT Pub. No.: WO2017/122409
PCT Pub. Date: Jul. 20, 2017

(65) Prior Publication Data
US 2019/0278161 A1 Sep. 12, 2019

(30) Foreign Application Priority Data
Jan. 15, 2016 (JP) ................... 2016-006080

(51) Int. Cl.
*G03B 21/16* (2006.01)
*G03B 21/20* (2006.01)
(Continued)

(52) U.S. Cl.
CPC ............. *G03B 21/16* (2013.01); *G03B 21/00* (2013.01); *G03B 21/2033* (2013.01); *H04N 5/74* (2013.01); *H04N 9/3144* (2013.01); *H05K 7/20* (2013.01)

(58) Field of Classification Search
CPC ...... G03B 21/006; G03B 21/16; G03B 21/28; G03B 21/2033; G03B 21/2053;
(Continued)

(56) References Cited

U.S. PATENT DOCUMENTS

2005/0185146 A1    8/2005   Fujimori et al.
2006/0072078 A1*   4/2006   Kim ................ F21V 7/0091
                                                            353/94
(Continued)

FOREIGN PATENT DOCUMENTS

JP      2005-227685 A      8/2005
JP      2006-98759 A       4/2006
(Continued)

OTHER PUBLICATIONS

International Search Report dated Jan. 24, 2017 in PCT/JP2016/081375 filed Oct. 21, 2016.

*Primary Examiner* — Sultan Chowdhury
(74) *Attorney, Agent, or Firm* — Oblon, McClelland, Maier & Neustadt, L.L.P.

(57) ABSTRACT

An object of the present invention is to provide a projector which is capable of reducing mechanical stress of an optical panel due to vibration of a coolant tube through which a coolant for cooling the optical panel is made to flow.
A projector according to the present invention includes: an optical panel (60R, 60G, 60B); a heat receiving plate (30a, 30b, 30c) including a coolant passage inside and configured to receive heat released by the optical panel; a coolant tube (21a, 23a, 23b, 25a, 25b, 27a) having flexibility and connected to the heat receiving plate; and a supporting portion to which the coolant tube extending from the heat receiving plate is connected. The coolant tube is disposed along a direction in which a plane of the heat receiving plate is disposed at least at a portion where the coolant tube is connected to the heat receiving plate and a portion where the coolant tube is connected to the supporting portion.

10 Claims, 8 Drawing Sheets

(51) Int. Cl.
*H04N 9/31* (2006.01)
*H04N 5/74* (2006.01)
*G03B 21/00* (2006.01)
*H05K 7/20* (2006.01)

(58) Field of Classification Search
CPC .......... F21V 29/54; F21V 29/59; F21V 29/89; H04N 9/3141; H04N 9/3144
See application file for complete search history.

(56) References Cited

U.S. PATENT DOCUMENTS

| | | | |
|---|---|---|---|
| 2007/0103647 A1 | 5/2007 | Egawa et al. | |
| 2007/0258051 A1* | 11/2007 | Kitabayashi | H04N 9/3144 353/31 |
| 2009/0086169 A1* | 4/2009 | Nakamura | G03B 21/006 353/31 |
| 2009/0237619 A1 | 9/2009 | Yanagisawa et al. | |
| 2009/0266098 A1 | 10/2009 | Nishijima et al. | |
| 2009/0290131 A1* | 11/2009 | Kim | G03B 21/16 353/61 |
| 2011/0249444 A1* | 10/2011 | Hayashi | G02F 1/133385 362/294 |
| 2011/0299243 A1 | 12/2011 | Yamaura | |
| 2012/0086914 A1* | 4/2012 | Furihata | G03B 21/14 353/15 |
| 2013/0314600 A1* | 11/2013 | Asano | H04N 9/3144 348/571 |

FOREIGN PATENT DOCUMENTS

| | | |
|---|---|---|
| JP | 2007-41414 A | 2/2007 |
| JP | 2007-148341 A | 6/2007 |
| JP | 2009-258622 A | 11/2009 |
| JP | 2009-267181 A | 11/2009 |
| JP | 2012-16264 A | 1/2012 |
| JP | 2015-108697 A | 6/2015 |

* cited by examiner

PROJECTOR FOR REDUCING MECHANICAL STRESS OF AN OPTICAL PANEL DUE TO VIBRATION

TECHNICAL FIELD

The present disclosure relates to a projector.

BACKGROUND ART

A projector which is a projection-type display apparatus displays an image by modulating light incident from a light source and enlarging and projecting the modulated light on a screen. As the projector, there is a projector including an optical panel such as a liquid crystal panel which functions as a light valve. At such a projector, light with relatively high intensity is made incident on the optical panel to enlarge and project an image on the screen. Therefore, a temperature of the optical panel is likely to increase by radiation of light, and there is a possibility that image quality may degrade due to thermal strain such as thermal expansion in association with such increase in the temperature.

Therefore, Patent Literature 1 discloses a projector which cools a liquid crystal panel using a coolant. Such a projector includes inside an optical element holding portion having a flow channel, inside of which the coolant flows, to hold the liquid crystal panel, a liquid pumping unit which sucks and pumps the coolant, a supply tank, inside of which the coolant is retained, a radiator which receives heat of the liquid crystal panel, and a tubular member connected so that the coolant circulates through the optical element holding portion, the liquid pumping unit, the supply tank and the radiator.

CITATION LIST

Patent Literature

Patent Literature 1: JP 2015-108697A

DISCLOSURE OF INVENTION

Technical Problem

Here, in the projector disclosed in Patent Literature 1, the tubular member through which the coolant is made to flow is connected to the optical element holding portion which holds the liquid crystal panel. Therefore, there is a case where, as a result of the tubular member vibrating due to vibration or an impact provided to the projector, stress is applied on the optical element holding portion. In such a case, there is a possibility that mechanical stress may be also applied on the liquid crystal panel held by the optical element holding portion, which may lead to degradation of image quality of an image to be enlarged and projected.

Therefore, the present disclosure proposes a new and improved projector which is capable of reducing mechanical stress of an optical panel due to vibration of a coolant tube through which a coolant for cooling the optical panel is made to flow.

Solution to Problem

According to the present disclosure, there is provided a projector including: an optical panel; a heat receiving plate including a coolant passage inside and configured to receive heat released by the optical panel; a coolant tube having flexibility and connected to the heat receiving plate; and a supporting portion to which the coolant tube extending from the heat receiving plate is connected. The coolant tube is disposed along a direction in which a plane of the heat receiving plate is disposed at least at a portion where the coolant tube is connected to the heat receiving plate and a portion where the coolant tube is connected to the supporting portion.

Advantageous Effects of Invention

As described above, according to the present disclosure, it is possible to reduce mechanical stress of an optical panel due to vibration of a coolant tube through which a coolant for cooling the optical panel is made to flow.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
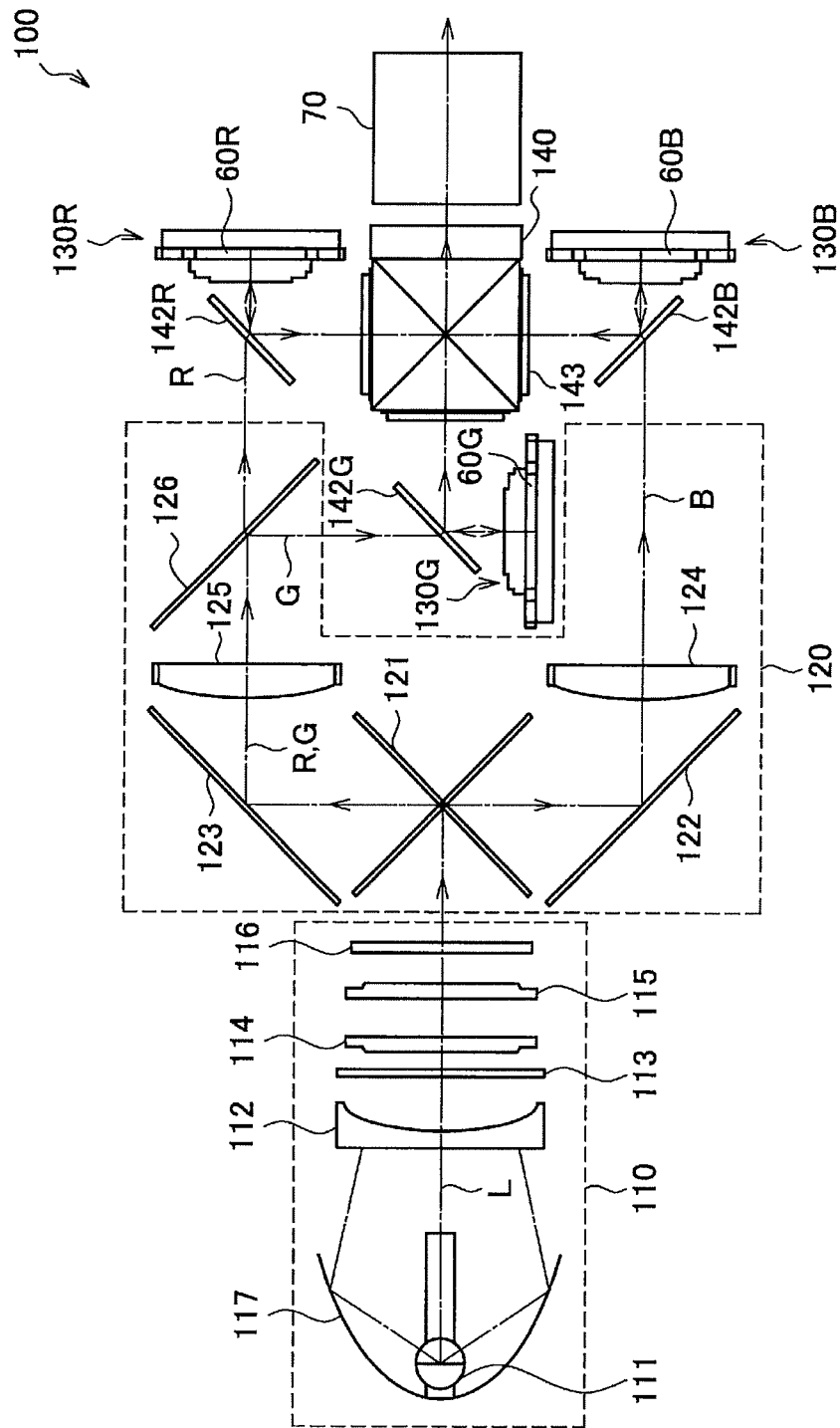
FIG. 1 is a schematic diagram illustrating a basic configuration of a projector according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.
1. Example of basic configuration of projector
2. Example of entire configuration of liquid cooling system 3. Connection structure of coolant tubes
3-1. Mechanical stress of reflective liquid crystal panel
3-2. Configuration example of connection structure of coolant tubes <1. Example of Basic Configuration of Projector>

First, a schematic configuration of a projector 100 according to an embodiment of the present disclosure will be described with reference to FIG. 1. The projector 100 according to the present embodiment performs color image display using three reflective liquid crystal panels as optical panels. Such a projector 100 separates light from a light source into three primary colors of red, green and blue and performs color image display using three reflective liquid crystal panels for the three respective colors. The three reflective liquid crystal panels corresponding to the respective colors may have the same configuration. The projector 100 is used as, for example, a projector for a digital cinema.

As illustrated in FIG. 1, the projector 100 includes an illumination optical system 110 which emits light L, a spectroscopic optical system 120 which disperses the light L emitted from the illumination optical system 110, and three liquid crystal display units 130 (130R, 130G, 130B) which modulate the light L. Further, the projector 100 includes a photosynthesizing unit 140 which synthesizes the light L modulated by the three liquid crystal display units 130R, 130G and 130B, and a projection optical system 70 which projects the light L synthesized by the photosynthesizing unit 140. Reflective polarization elements 142R, 142G and 142B are respectively provided between the spectroscopic optical system 120 and the three liquid crystal display units 130R, 130G and 130B.

The illumination optical system 110 includes a light source 111, a concave lens 112 which arranges the light L emitted from the light source 111 to substantially parallel light, a UV cut filter 113, a first fly eye lens 114, a second fly eye lens 115, and a condenser lens 116. In the present embodiment, the illumination optical system 110 functions as a light source unit which can emit light including red light, green light and blue light.

As the light source 111, for example, a xenon lamp, a halogen lamp, a super high-pressure mercury lamp, or the like, is used. A reflector 117 which reflects the light L emitted from the light source 111 is provided around the light source 111. The light L reflected by the reflector 117 is emitted to the concave lens 112. The light which is transmitted through the concave lens 112 is emitted to the UV cut filter 113, and ultraviolet light is removed by the UV cut filter 113.

Types of the light source 111 are not limited, and a solid state light source such as, for example, a laser diode (LD) which is capable of emitting laser light and a light emitting diode (LED) may be used. For example, solid state light sources for RGB which are capable of emitting light of respective colors of RGB may be prepared, and white light may be generated by the emitted light of these colors being synthesized. Alternatively, a solid state light source which emits light of a wavelength band of blue and a fluorescent body which emits yellow fluorescence by being excited by blue light may be prepared. In this case, white light is emitted by blue light and yellow light being synthesized.

The light L transmitted through the UV cut filter 113 is incident on the first and the second fly eye lenses 114 and 115. As a result of the light L being transmitted through these first and second fly eye lenses 114 and 115, luminance unevenness of the light L is reduced. The light L transmitted through the first and the second fly eye lenses 114 and 115 is incident on the condenser lens 116. The light incident on the condenser lens 116 is condensed and emitted to the spectroscopic optical system 120.

The spectroscopic optical system 120 includes a first dichroic mirror 121, two reflective mirrors 122 and 123, two collecting lenses 124 and 125, and a second dichroic mirror 126. The first dichroic mirror 121 disperses the light L emitted from the illumination optical system 110 into blue light B on a short wavelength side, red light R and green light G on a long wavelength side. The blue light B dispersed by the first dichroic mirror 121 is reflected by the first reflective mirror 122 and incident on the first collecting lens 124. Then, the blue light B collected by the first collecting lens 124 is incident on the liquid crystal display unit 130B via the reflective polarization element 142B. As the reflective polarization element 142B, a prism-type beam splitter, a wire grid polarizer, or the like, is used.

The red light R and the green light G dispersed by the first dichroic mirror 121 are reflected by the second reflective mirror 123 and incident on the second collecting lens 125. Then, the red light R and the green light G collected by the second collecting lens 125 are emitted to the second dichroic mirror 126. The second dichroic mirror 126 disperses the red light R and the green light G to green light G on a short wavelength side and red light R on a long wavelength side. The dispersed red light R is incident on the liquid crystal display unit 130R via the reflective polarization element 142R. The green light G is incident on the liquid crystal display unit 130G via the reflective polarization element 142G.

The light R, G and B of respective colors incident on the liquid crystal display units 130R, 130G and 130B is modulated into image light having intensity distribution in accordance with respective image information and reflected by reflective liquid crystal panels 60 (60R, 60G, 60B) respectively provided at the liquid crystal display units 130R, 130G and 130B. Then, the modulated three types of image light (also referred to as red modulated light R, green modulated light G and blue modulated light B as appropriate) are reflected by the reflective polarization elements 142R, 142G and 142B and incident on a photosynthesizing unit 140. In this event, polarization directions of the modulated light of respective colors are arranged by a polarizing plate 143 provided at the photosynthesizing unit 140. By this means, contrast is improved. Note that, in the following description, the reflective liquid crystal panel 60R, the reflective liquid crystal panel 60G and the reflective liquid crystal panel 60B will be referred to as a "reflective liquid crystal panel 60" in common.

In the present embodiment, the reflective liquid crystal panel 60 corresponds to one or more light modulation elements which modulate light from the light source unit and emit the modulated light. That is, three reflective liquid crystal panels 60R, 60G and 60B function as three light modulation elements which respectively modulate red light, green light and blue light.

The photosynthesizing unit 140 is configured with, for example, a dichroic prism, or the like. The photosynthesizing unit 140 synthesizes three types of modulated light modulated by the liquid crystal display units 130R, 130G and 130B on the same light path and emits the synthesized light to the projection optical system 70. The synthesized light is then enlarged to a predetermined magnification by the projection optical system 70 and projected on a screen which is not illustrated. By this means, a color image is displayed. Specific configurations of the photosynthesizing unit 140 and the projection optical system 70 are not limited and may be arbitrarily designed.

<2. Example of Entire Configuration of Liquid Cooling System>

Figure 2:
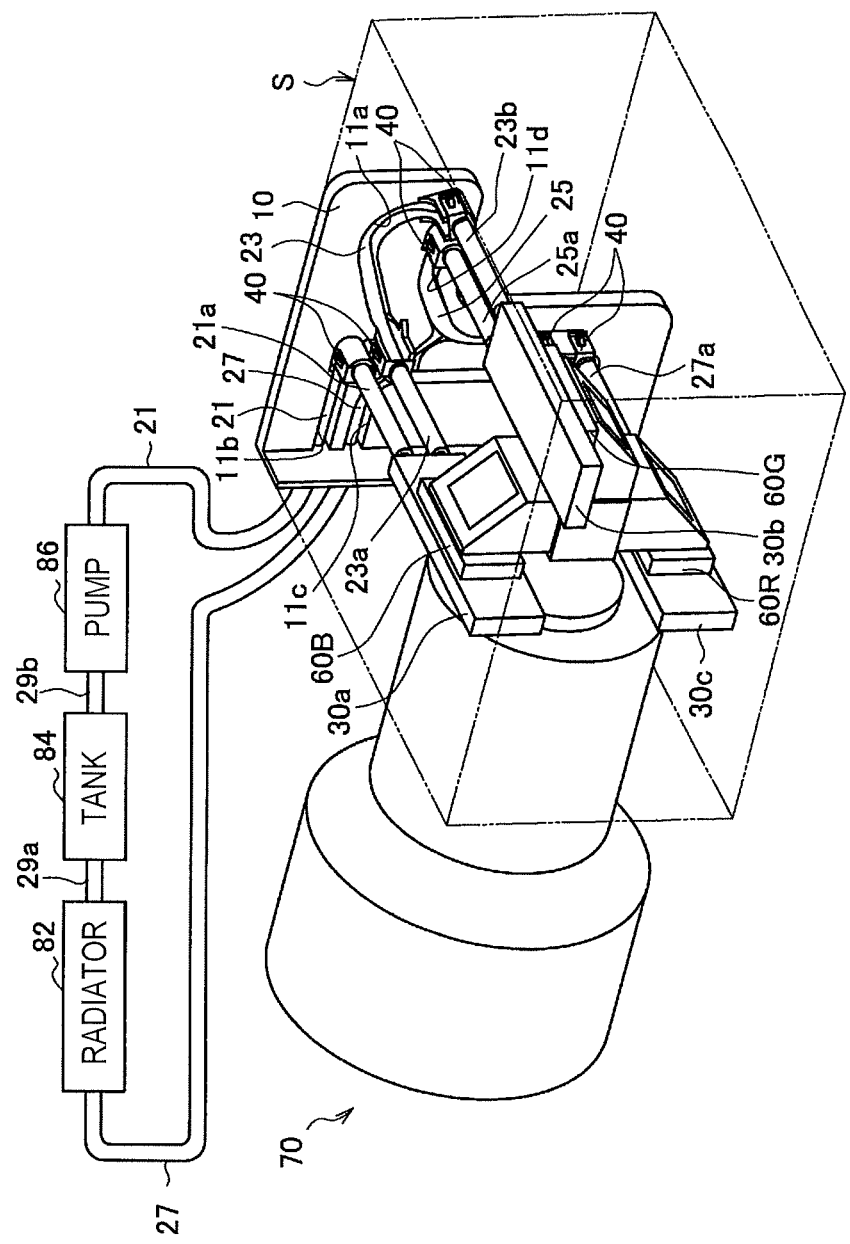
FIG. 2 is a schematic diagram illustrating a configuration example of a liquid cooling system of the projector according to the embodiment.
Figure 3:
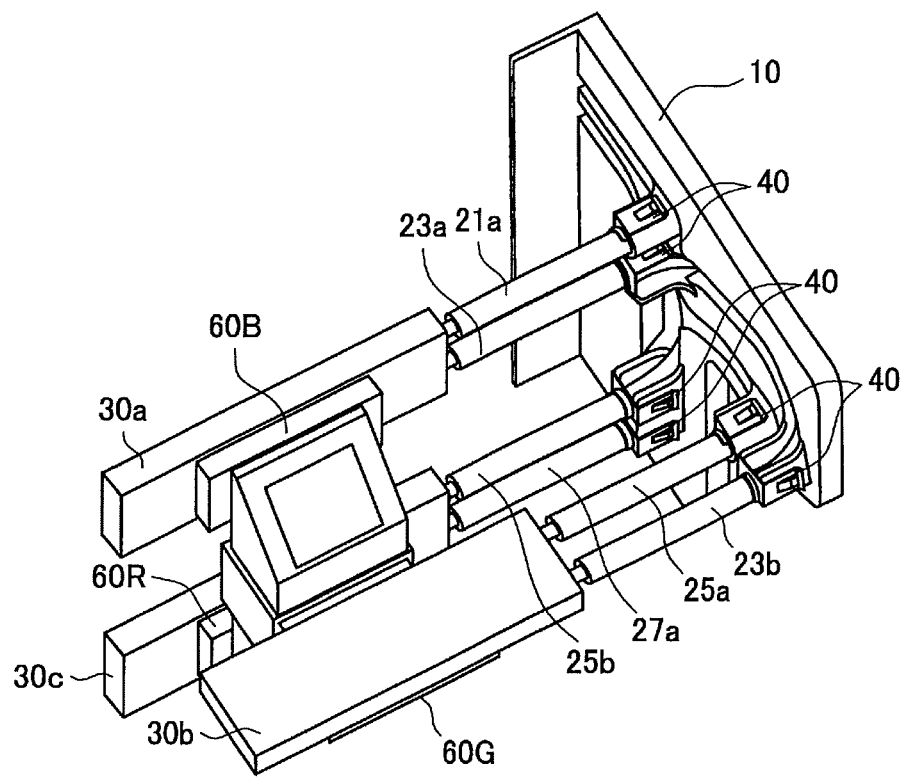
FIG. 3 is a schematic diagram illustrating a configuration example of a liquid cooing system within dust-proof space of the projector according to the embodiment.
Figure 4:
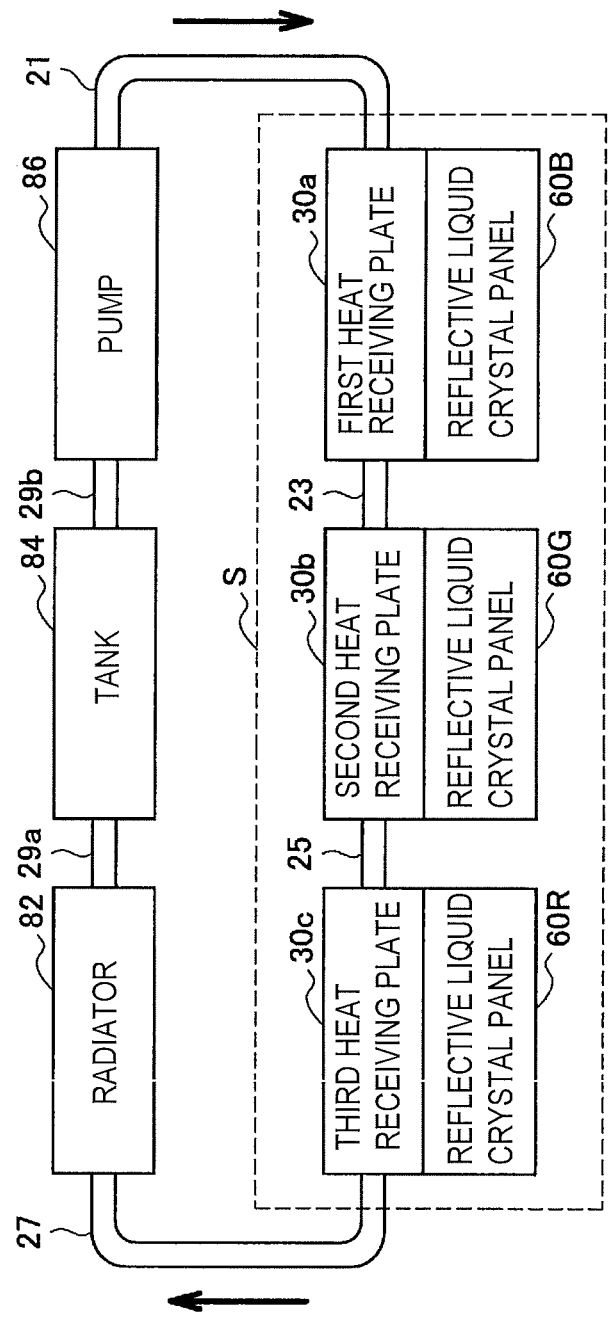
FIG. 4 is a block diagram illustrating a configuration example of the liquid cooling system of the projector according to the embodiment.

A configuration example of a cooling system using a coolant (hereinafter, also referred to as a "liquid cooling system") provided at the projector 100 according to the present embodiment will be described next with reference to FIG. 2 to FIG. 4. FIG. 2 is a schematic diagram for explaining the configuration example of the liquid cooling system of the projector 100 according to the present embodiment, and FIG. 3 is a perspective view of part of the liquid cooling system in FIG. 2 seen from a different angle. Further, FIG. 4 is a block diagram for explaining the configuration example of the liquid cooling system of the projector 100 according to the present embodiment.

At the projector 100, to enlarge and project an image on a screen, or the like, through the projection optical system 70, light with relatively high intensity is incident on the reflective liquid crystal panel 60. A temperature of the reflective liquid crystal panel 60 is likely to increase by radiation of such light, and image quality becomes more likely to degrade due to thermal strain such as thermal expansion. Therefore, at the projector 100 according to the present embodiment, the reflective liquid crystal panel 60 is cooled by the liquid cooling system using the coolant.

The liquid cooling system is configured as a coolant circuit which includes a radiator 82, a tank 84, a pump 86, a first heat receiving plate 30*a*, a second heat receiving plate 30*b* and a third heat receiving plate 30*c*. Such a liquid cooling system is a system which cools the three reflective liquid crystal panels 60R, 60G and 60B using water or an antifreeze liquid as the coolant. The radiator 82, the tank 84, the pump 86, the first heat receiving plate 30*a*, the second heat receiving plate 30*b* and the third heat receiving plate 30*c* are connected with coolant tubes (21, 23, 25, 27, 29*a*, 29*b*) so that the coolant circulates and flows through the radiator 82, the tank 84, the pump 86, the first heat receiving plate 30*a*, the second heat receiving plate 30*b* and the third heat receiving plate 30*c* in this order.

The pump 86 is connected to the first heat receiving plate 30*a* with the coolant tube 21, and the first heat receiving plate 30*a* is connected to the second heat receiving plate 30*b* with the coolant tube 23. Further, the second heat receiving plate 30*b* is connected to the third heat receiving plate 30*c* with the coolant tube 25, and the third heat receiving plate 30*c* is connected to the radiator 82 with the coolant tube 27. The radiator 82 is connected to the tank 84 with the coolant tube 29*a*, and the tank 84 is connected to the pump 86 with the coolant tube 29*b*. Note that, in the following description, the first heat receiving plate 30*a*, the second heat receiving plate 30*b* and the third heat receiving plate 30*c* will be referred to as a "heat receiving plate 30" in common.

The radiator 82 has a function as a heat releasing unit which causes heat of the coolant to be released to lower a temperature of the coolant. The radiator 82 may have, for example, an air-cooling type heat exchanger structure and may cause the coolant which passes inside the radiator 82 to release heat. As the heat releasing unit, a heatsink may be used in place of the radiator 82, or a heat releasing unit having other configurations may be used. The tank 84 has a function as a retaining unit which retains the coolant whose heat has been released at the radiator 82. A configuration of the tank 84 is not particularly limited. The pump 86 has a function as a pumping unit which sucks and pumps the coolant within the tank 84. As the pump 86, for example, an electric motor pump is used. Output of the pump 86 may be, for example, controlled so that a temperature of the coolant is maintained at a predetermined target temperature.

The first heat receiving plate 30*a* is provided in contact with the reflective liquid crystal panel 60B. The second heat receiving plate 30*b* is provided in contact with the reflective liquid crystal panel 60G. The third heat receiving plate 30*c* is provided in contact with the reflective liquid crystal panel 60R. The heat receiving plate 30 is formed in a plate shape with a material having high thermal conductivity, which is typified by aluminum. Further, the heat receiving plate 30 has a coolant passage for causing the coolant to circulate inside, so that the coolant can flow inside the heat receiving plate 30. When the coolant passes inside the heat receiving plate 30, heat is exchanged between the reflective liquid crystal panel 60 and the coolant, and, as a result of heat released from the reflective liquid crystal panel 60 being received by the heat receiving plate 30, the reflective liquid crystal panel 60 is cooled.

The plate-like heat receiving plate 30 is provided so as to contact with a substrate surface of the reflective liquid crystal panel 60. That is, a direction in which a plane of the heat receiving plate 30 is provided matches a direction along a direction in which a substrate of the reflective liquid crystal panel 60 is disposed and intersects with a width direction of a gap between substrates. Note that the heat receiving plate 30 may directly contact with the reflective liquid crystal panel 60 or may contact via a member with high thermal conductivity.

The three heat receiving plates 30 are connected in series with the coolant tubes 23 and 25. At the projector 100 according to the present embodiment, the coolant which is pumped by the pump 86 passes through the first heat receiving plate 30*a* provided in contact with the reflective liquid crystal panel 60B for blue light LB, the second heat receiving plate 30*b* provided in contact with the reflective liquid crystal panel 60B for green light LG and the third heat receiving plate 30*c* provided in contact with the reflective liquid crystal panel 60R for red light LR in this order, and returns to the radiator 82. That is, the coolant passes through the three heat receiving plates 30 in ascending order of a wavelength of light to be incident on the reflective liquid crystal panels 60 with which the heat receiving plates 30 contact, in other words, in descending order of a heat generation amount of the reflective liquid crystal panels 60 with which the heat receiving plates 30 contact. By this means, variation of the temperatures of the three reflective liquid crystal panels 60R, 60G and 60B is suppressed.

At the projector 100 according to the present embodiment, the reflective liquid crystal panel 60 and the heat receiving plate 30 are disposed within dust-proof space S. The dust-proof space S is cut off from outside by members which become a bulkhead being combined, and grit and dust are difficult to enter inside. By this means, grit and dust are gathered around the reflective liquid crystal panel 60 by an optical dust collection effect, so that degradation of image quality such as reduction in luminance of an image to be projected and change of color is less likely to occur. Particularly, in the case where the projector 100 includes, for example, a blast fan which is not illustrated, to cool parts other than the reflective liquid crystal panel 60, as a result of the dust-proof space S being provided, gathering of grit and dust which fly by blast around the reflective liquid crystal panel 60 is suppressed.

In the liquid cooling system, while the three heat receiving plates 30 are disposed inside the dust-proof space S, the radiator 82, the tank 84 and the pump 86 are disposed outside the dust-proof space S. One end of the coolant tube 21 is connected to the first heat receiving plate 30*a* inside the dust-proof space S, and the other end is connected to the pump 86 outside the dust-proof space S. Further, one end of the coolant tube 27 is connected to the third heat receiving plate 30c inside the dust-proof space S, and the other end is connected to the radiator 82 outside the dust-proof space S. As a result of the radiator 82 as a heat releasing unit being provided outside the dust-proof space S in which the reflective liquid crystal panel 60 to be cooled exists, it is possible to reduce a heat amount inside the dust-proof space S while ensuring dust resistance inside the dust-proof space S. By this means, cooling efficiency of the reflective liquid crystal panel 60 is improved.

<3. Connection Structure of Coolant Tubes>

A connection structure of the coolant tubes in the liquid cooling system of the projector 100 according to the present embodiment will be described next. In the following description, after background of the projector 100 according to the present embodiment employing a predetermined connection structure of coolant tubes is described, the connection structure of the coolant tubes will be specifically described.

(3-1. Mechanical Stress of Reflective Liquid Crystal Panel)

In the case where the reflective liquid crystal panel 60 is cooled by the liquid cooling system, a coolant tube which injects the coolant into the heat receiving plate 30 and ejects the coolant from the heat receiving plate 30 is required. In this event, for example, in the case where a metal tube is employed as the coolant tube, because the metal tube is relatively heavy, the heat receiving plate 30 is more likely to be subjected to a load by the own weight of the metal tube which is connected to and hangs from the heat receiving plate 30. Further, even in the case where a member which supports such a metal tube is provided to support the metal tube, vibration or an impact is directly transmitted to the heat receiving plate 30 via the metal tube with high stiffness when an impact is given to the projector 100 or the projector 100 vibrates.

If stress is applied on the heat receiving plate 30 by such vibration or an impact, mechanical stress is applied on the reflective liquid crystal panel 60 which contacts with the heat receiving plate 30, so that image quality of an image to be displayed becomes more likely to degrade. Specifically, at the liquid crystal panel, color unevenness, degradation in contrast, or the like, are likely to occur by change in size of a gap between the substrates on which liquid crystal materials are disposed, or the like. Particularly, at the reflective liquid crystal panel 60, because incident light passes through inside the panel twice, an optical path length is likely to change by change in size of the gap between the substrates, and image quality is likely to degrade. Therefore, if mechanical stress is applied on the liquid crystal panel in a width direction of the gap between the substrates, image quality of an image to be displayed is likely to degrade.

In contrast to this, at the projector 100 according to the present embodiment, a coolant tube which includes an elastic rubber and which has flexibility is employed as the coolant tube. A material of the coolant tube is not limited to an elastic rubber, and the material is not limited if the coolant tube is formed so as to be able to exert elasticity upon vibration. As such a coolant tube, normally, a straight tube is used in terms of formability, production cost and versatility. In the case where the coolant tube having flexibility is used, an impact or vibration with respect to the projector 100 becomes less likely to be directly transmitted to the heat receiving plate 30 by a damper effect of the coolant tube. However, there is a possible case where even the coolant tube having flexibility may apply a load on the heat receiving plate 30 by the own weight of the coolant tube. Further, in the case where the coolant tube is in a deflected state, there is a possible case where a load is applied on the heat receiving plate 30 by reaction force caused by the deflection.

In view of the background as described above, at the projector 100 according to the present embodiment, while a liquid cooling system which cools the reflective liquid crystal panel 60 using the coolant is employed, a load to be applied on the heat receiving plate 30 is reduced. By this means, mechanical stress in a width direction of a gap between the substrates becomes less likely to be placed on the reflective liquid crystal panel 60.

(3-2. Configuration Example of Connection Structure of Coolant Tubes)

As illustrated in FIG. 2 and FIG. 3, a piping portion 21a on one end side of the coolant tube 21 which connects the pump 86 and the first heat receiving plate 30a is connected to the first heat receiving plate 30a, part of the central portion of the coolant tube 21 is supported by the supporting portion 10, and the other end side of the coolant tube 21 is derived outside of the dust-proof space S. At the supporting portion 10, a groove portion 11b in which part of the coolant tube 21 is disposed is provided. Further, a piping portion 23a on one end side of the coolant tube 23 which connects the first heat receiving plate 30a and the second heat receiving plate 30b is connected to the first heat receiving plate 30a, a piping portion 23b on the other end side is connected to the second heat receiving plate 30b, and the central portion of the coolant tube 23 is supported by the supporting portion 10. At the supporting portion 10, a groove portion 11a in which part of the coolant tube 23 is disposed is provided.

Further, a piping portion 25a on one end side of the coolant tube 25 which connects the second heat receiving plate 30b and the third heat receiving plate 30c is connected to the second heat receiving plate 30b, a piping portion 25b on the other end side is connected to the third heat receiving plate 30c, and the central portion of the coolant tube 25 is supported by the supporting portion 10. At the supporting portion 10, a groove portion 11d in which part of the coolant tube 27 is disposed is provided. Further, a piping portion 27a on one end side of the coolant tube 27 which connects the third heat receiving plate 30c and the radiator 82 is connected to the third heat receiving plate 30c, part of the central portion of the coolant tube 27 is supported by the supporting portion 10, and the other end side is derived outside of the dust-proof space S. At the supporting portion 10, groove portions 11c and 11d in which part of the coolant tube 27 is disposed are provided.

The supporting portion 10 is configured as part of a bulkhead which forms the dust-proof space S. The groove portions 11a, 11b, 11c and 11d provided at the supporting portion 10 are formed so as not to penetrate to the back surface side of the supporting portion 10 illustrated in FIG. 2 and FIG. 3, to prevent the dust-proof space S from being communicated with outside. Further, because the two coolant tubes 25 and 27 are disposed at part of the groove portion 11d, depth of the portion is made deeper than depth of other groove portions 11a, 11b and 11c. Such a supporting portion 10 includes a resin material. While, as the resin material, for example, an acrylonitrile-butadiene-styrene resin (ABS) or polycarbonate (PC) can be used, other engineering plastics may be used.

Further, three coolant tubes 21, 23 and 25 out of the coolant tubes 21, 23, 25 and 27 have the same length. By part of the coolant tubes 21, 23, 25 and 27 being caused to be supported by the supporting portion 10, it is possible to use the coolant tubes 21, 23 and 25 having the same length without making piping on space complicated, and it is possible to share parts.

While the first heat receiving plate 30a and the third heat receiving plate 30c are disposed on substantially the same plane, the second heat receiving plate 30b is disposed on a plane which is orthogonal to the plane on which the first heat receiving plate 30a and the third heat receiving plate 30c are disposed. Further, the supporting portion 10 which supports part of each of the coolant tubes 21, 23, 25 and 27 is disposed along a plane which is substantially orthogonal to each of the plane on which the first heat receiving plate 30a and the third heat receiving plate 30c are disposed and the plane on which the second heat receiving plate 30b is disposed. The piping portions 21a, 23a, 23b, 25a, 25b and 27a connected to the respective heat receiving plates 30 are derived from the supporting portion 10 toward a direction which is substantially orthogonal to the plane formed by the supporting portion 10, extend along a direction of the plane of the heat receiving plate 30 and are connected to one end portion of the heat receiving plate 30.

That is, at the projector 100 according to the present embodiment, the piping portions 21a, 23a, 23b, 25a, 25b and 27a connected to the respective heat receiving plates 30 extend in a direction in which the plane of the heat receiving plate 30 is disposed and are connected to the supporting portion 10. At portions where the piping portions 21a, 23a, 23b, 25a, 25b and 27a are connected to the supporting portion 10, the piping portions 21a, 23a, 23b, 25a, 25b and 27a are fixed at the supporting portion 10 with fixing fixtures 40. Therefore, the coolant tubes 21, 23, 25 and 27 connected to the heat receiving plate 30 is prevented from hanging from the heat receiving plate 30 without being supported by any member. By this means, application of a load on the heat receiving plate 30 by the own weight of the coolant tubes 21, 23, 25 and 27 is suppressed.

Further, at the projector 100 according to the present embodiment, portions where the respective heat receiving plates 30 are connected to the piping portions 21a, 23a, 23b, 25a, 25b and 27a extend along a direction in which planes of the respective heat receiving plates 30 are disposed. Further, also portions where the piping portions 21a, 23a, 23b, 25a, 25b and 27a are connected to the supporting portion 10 extend along a direction in which the planes of the heat receiving plates 30 are disposed. That is, the portions where the heat receiving plates 30 are connected to the piping portions 21a, 23a, 23b, 25a, 25b and 27a, and the portions where the supporting portion 10 is connected to the piping portions 21a, 23a, 23b, 25a, 25b and 27a are disposed on substantially the same plane which extends along the direction in which the planes of the heat receiving plates 30 are disposed.

Therefore, the piping portions 21a, 23a, 23b, 25a, 25b and 27a which extend from the heat receiving plate 30 to the supporting portion 10 are held so as not to largely deflect. By this means, application of a load on the heat receiving plate 30 by reaction force caused by deflection of the coolant tubes 21, 23, 25 and 27 is suppressed. If length of the piping portions 21a, 23a, 23b, 25a, 25b and 27a is too long, there is a case where the piping portions 21a, 23a, 23b, 25a, 25b and 27a may deflect by the own weight of the piping portions 21a, 23a, 23b, 25a, 25b and 27a. Further, if the length of the piping portions 21a, 23a, 23b, 25a, 25b and 27a is too short, there is a case where elasticity of the piping portions 21a, 23a, 23b, 25a, 25b and 27a is reduced. The length of the piping portions 21a, 23a, 23b, 25a, 25b and 27a between the heat receiving plate 30 and the supporting portion 10 can be set within a range, for example, between 30 and 100 mm while the length depends on materials of the coolant tubes 21, 23, 25 and 27.

Further, the coolant flows into the heat receiving plate 30 from a side of the reflective liquid crystal panel 60 via the piping portions 21a, 23b and 25b. By this means, mechanical stress to be applied on the reflective liquid crystal panel 60 via the heat receiving plate 30 by a supply pressure of the coolant is suppressed.

Here, the connection structure of the coolant tubes in the liquid cooling system of the projector 100 according to the present embodiment will be more specifically described using an example of the connection structure of the coolant tubes 21 and 23 with respect to the first heat receiving plate 30a.

Figure 5:
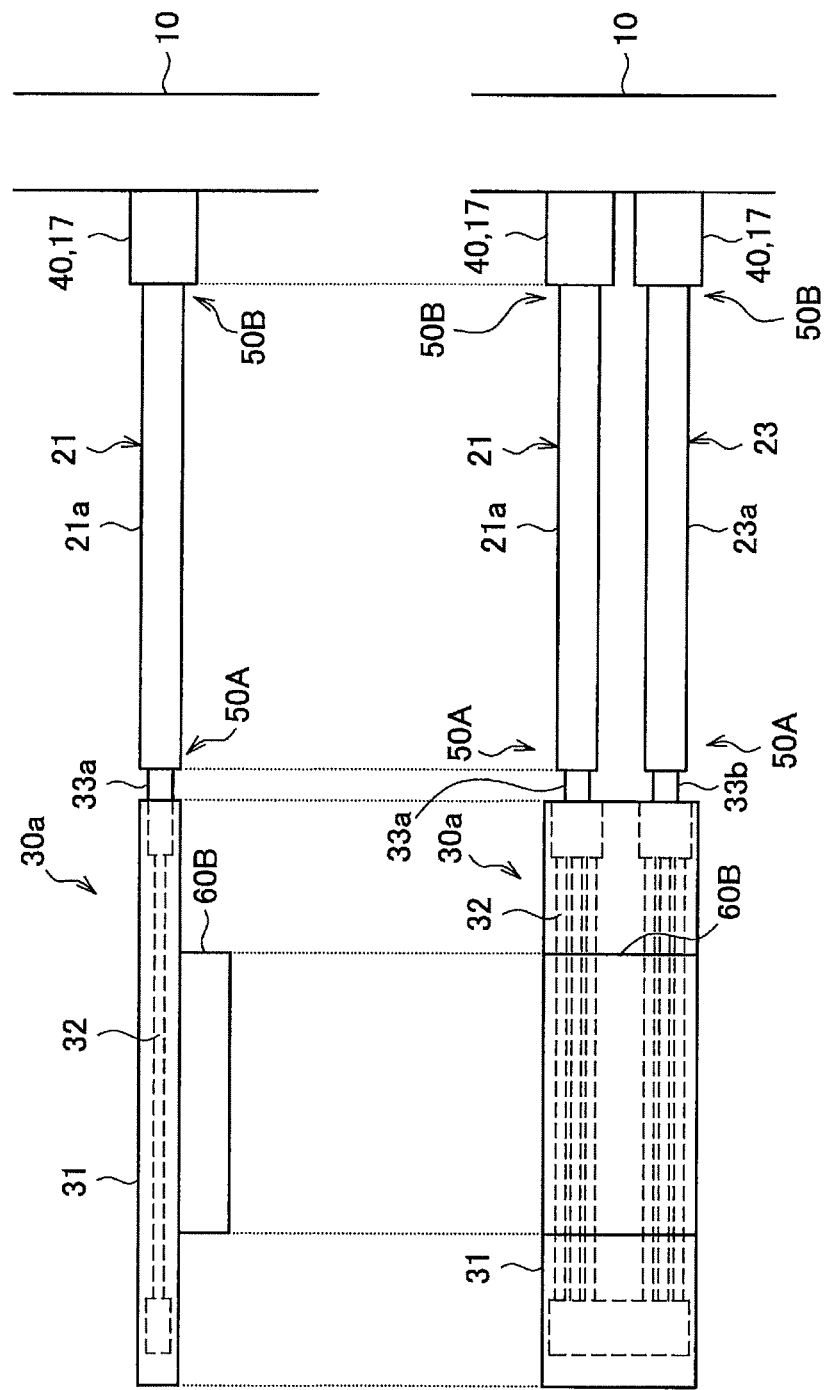
FIG. 5 is an explanatory diagram illustrating a connection structure of coolant tubes of the projector according to the embodiment.

FIG. 5 illustrates a side view and a top view of portions where the first heat receiving plate 30a is connected to the coolant tubes 21 and 23. The first heat receiving plate 30a has a plate-like body portion 31 having a rectangular planar shape, and contacts with the reflective liquid crystal panel 60B at the central portion on one surface side of the plate-like body portion 31. The first heat receiving plate 30a has a coolant passage 32 inside the body portion 31, and has an injection side connection portion 33a and an ejection side connection portion 33b which are communicated with the coolant passage 32 at one end portion in a longitudinal direction. The injection side connection portion 33a and the ejection side connection portion 33b may be configured as a cylindrical portion which projects along a direction in which a plane of the plate-like body portion 31 is disposed. The injection side connection portion 33a and the ejection side connection portion 33b which are illustrated project along a longitudinal direction of the body portion 31.

The coolant passage 32 is provided to circulate so as to guide the coolant injected to the first heat receiving plate 30a via the injection side connection portion 33a to the other end side and further guide the coolant to one end side. While the coolant circulates within the coolant passage 32, heat is exchanged between the reflective liquid crystal panel 60B and the coolant via the body portion 31, so that the reflective liquid crystal panel 60B is cooled. The coolant passage 32 may include a plurality of flow channels. In the case where the coolant passage 32 includes a plurality of flow channels, a surface area of the whole coolant passage 32 increases, so that cooling efficiency is improved. Note that the configuration of the coolant passage 32 is not limited to the illustrated example.

The inflow side piping portion 21a (coolant tube 21) through which the coolant flowing into the first heat receiving plate 30a flows is connected to the injection side connection portion 33a of the first heat receiving plate 30a. The piping portion 21a extends along a direction in which the plane of the first heat receiving plate 30a is disposed from a position of the injection side connection portion 33a and is supported by the supporting portion 10. That is, at a portion 50A where the piping portion 21a is connected to the first heat receiving plate 30a and a portion 50B where the piping portion 21a is connected to the supporting portion 10, the piping portion 21a is disposed along a direction in which the plane of the first heat receiving plate 30a is disposed. By this means, the piping portion 21a is disposed along a direction in which the plane of the first heat receiving plate 30a is disposed, so that deflection does not occur.

In a similar manner, the outflow side piping portion 23a (coolant tube 23) through which the coolant flowing out from the first heat receiving plate 30a flows is connected to the ejection side connection portion 33b of the first heat receiving plate 30a. The piping portion 23a extends along a direction in which the plane of the first heat receiving plate 30a is disposed from a position of the ejection side connection portion 33b and is supported by the supporting portion 10. That is, at the portion 50A where the piping portion 23a is connected to the first heat receiving plate 30a and the portion 50B where the piping portion 23a is connected to the supporting portion 10, the piping portion 23a is disposed along a direction in which the plane of the first heat receiving plate 30a is disposed. By this means, the piping portion 23a is disposed along a direction in which the plane of the first heat receiving plate 30a is disposed, so that deflection does not occur.

For example, the injection side connection portion 33a and the ejection side connection portion 33b project in a direction of the supporting portion 10 along a longitudinal direction of the plate-like body portion 31, and the piping portions 21a and 23a are connected to the injection side connection portion 33a and the ejection side connection portion 33b. Further, at the portion 50B where the supporting portion 10 is connected to the piping portions 21a and 23a, the piping portions 21a and 23a are fixed at the supporting portion 10 with a fixing fixture 40, and are derived toward the injection side connection portion 33a and the ejection side connection portion 33b. Therefore, the piping portions 21a and 23a are linearly disposed between the first heat receiving plate 30a and the supporting portion 10, and deflection does not occur. The inflow side piping portion 21a and the outflow side piping portion 23a are disposed in parallel at regular intervals, and a direction in which the coolant flows into the first heat receiving plate 30a becomes substantially the same as a direction in which the coolant flows out from the first heat receiving plate 30a.

Figure 6:
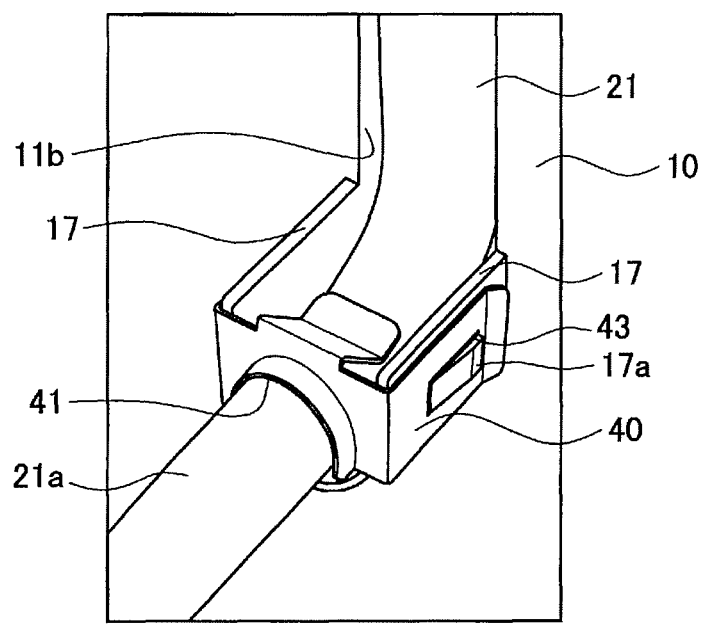
FIG. 6 is an explanatory diagram illustrating a portion where a cooling pipe is connected to a supporting portion.

FIG. 6 is an enlarged schematic diagram of the portion 50B where the supporting portion 10 is connected to the piping portion 21a. At the supporting portion 10, a guide portion 17 for erecting the coolant tube 21 disposed inside the groove portion 11b vertically with respect to the plane formed by the supporting portion 10 is provided. The guide portion 17 is provided to project in a direction orthogonal to the plane formed by the supporting portion 10. A cross-section orthogonal to the projecting direction (cross-section parallel to the plane formed by the supporting portion 10) of the guide portion 17 has a U shape, and a portion corresponding to a U-shaped opening portion is communicated with the groove portion 11b. That is, internal space of the guide portion 17 is formed so that the internal space of the groove portion 11b vertically erects. Locking projections 17a are provided on both sides of the guide portion 17.

The fixing fixture 40 is created by a plate-like metal member being bent, and includes a U-shaped opening portion 41 at which the coolant tube 21 is disposed and a locking opening portion 43 at which the locking projection 17a of the guide portion 17 is locked. The fixing fixture 40 is loaded at the guide portion 17 so that the coolant tube 21 is put between an inner surface of the guide portion 17 and the opening portion 41. In this event, the fixing fixture 40 is fixed at the guide portion 17 by the both sides of the guide portion 17 being sandwiched by the fixing fixture 40 from outside by elastomeric force of the fixing fixture 40 including a metal member and the locking opening portion 43 of the fixing fixture 40 being locked with the locking projection 17a of the guide portion 17. By this means, the coolant tube 21 is supported and fixed along the inner surface of the guide portion 17. As a result, the piping portion 21a derived from the guide portion 17 is disposed without being deflected, along a direction orthogonal to the plane formed by the supporting portion 10.

At the portion 50A where the piping portion 21a is connected to the first heat receiving plate 30a and the portion 50B where the piping portion 21a is connected to the supporting portion 10, because the piping portion 21a is disposed along a direction in which the plane of the first heat receiving plate 30a is disposed, and deflection does not occur at the piping portion 21a, reaction force with respect to the deflection of coolant tube 21 is suppressed. By this means, stress to be applied on the first heat receiving plate 30a is reduced, and mechanical stress to be applied on the reflective liquid crystal panel 60B is reduced.

Further, at the portion 50A where the piping portion 21a is connected to the first heat receiving plate 30a and the portion 50B where the piping portion 21a is connected to the supporting portion 10, as a result of the piping portion 21a being connected at the respective portions without being deflected, even if stress occurs in any direction on an outer circumference side of the piping portion 21a when an impact or vibration is provided at the projector 100 or the piping portion 21a, it is possible to reduce stress to be applied on the first heat receiving plate 30a.

Here, degradation in image quality of an image to be displayed due to stress which can be applied on the first heat receiving plate 30a in the case where deflection occurs at the piping portion 21a will be described with reference to FIG. 7 to FIG. 10 as a comparative example of the projector 100 according to the present embodiment.

Figure 7:
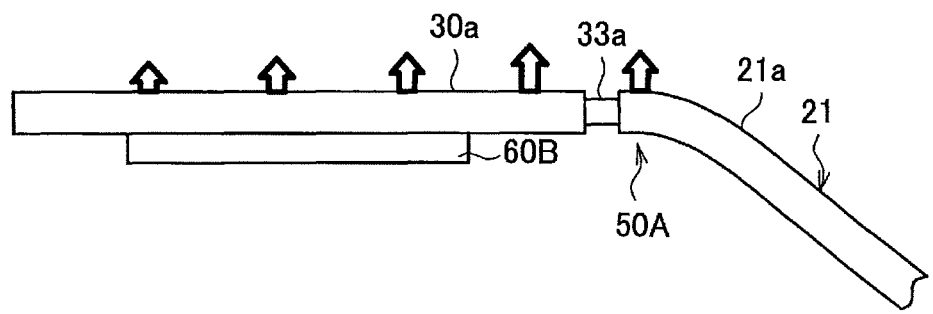
FIG. 7 is an explanatory diagram illustrating reaction force with respect to deflection of the cooling pipe.
Figure 8:
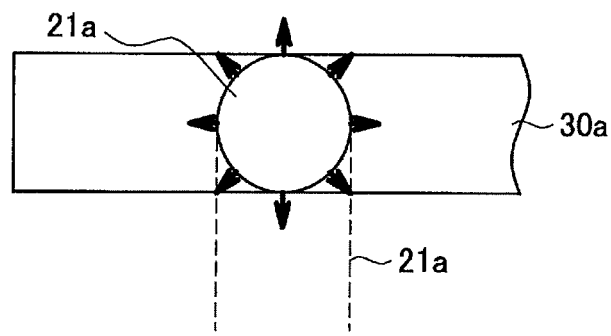
FIG. 8 is an explanatory diagram illustrating elasticity of the cooling pipe.
Figure 9:
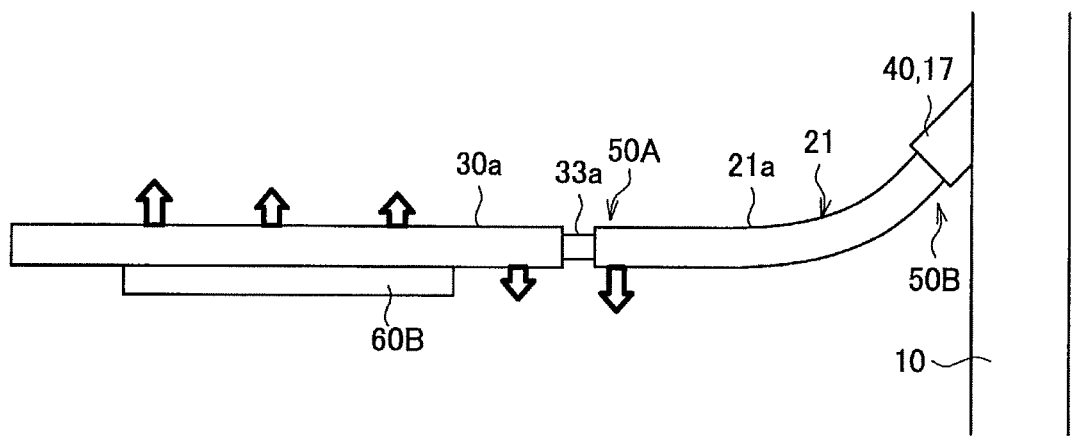
FIG. 9 is an explanatory diagram illustrating reaction force with respect to deflection of the cooling pipe.
Figure 10:
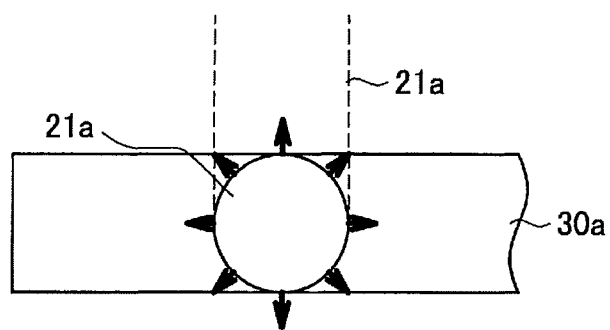
FIG. 10 is an explanatory diagram illustrating elasticity of the cooling pipe.

FIG. 7 illustrates a state where the piping portion 21a deflects in a direction which intersects with a direction in which the plane of the first heat receiving plate 30a is disposed, that is, toward a side on which the reflective liquid crystal panel 60B is disposed (downward in FIG. 7) at the portion 50A where the piping portion 21a is connected to the first heat receiving plate 30a. FIG. 8 is an explanatory diagram of the piping portion 21a and the first heat receiving plate 30a in FIG. 7, seen from the piping portion 21a side along a shaft direction of the piping portion 21a. Further, FIG. 9 illustrates a state where the piping portion 21a deflects in a direction which intersects with a direction in which the plane of the first heat receiving plate 30a is disposed, that is, toward a side (upward in FIG. 9) opposite to the side on which the reflective liquid crystal panel 60B is disposed at the portion 50B where the piping portion 21a is connected to the supporting portion 10. FIG. 10 is an explanatory diagram of the piping portion 21a and the first heat receiving plate 30a in FIG. 9, seen from the piping portion 21a side along the shaft direction of the piping portion 21a.

As illustrated in FIG. 7, at the portion 50A where the piping portion 21a is connected to the first heat receiving plate 30a, in the case where the piping portion 21a deflects toward a side on which the reflective liquid crystal panel 60B is disposed, the portion SOA where the piping portion 21a is connected to the first heat receiving plate 30a is pushed upward in FIG. 7 by reaction force with respect to deflection of the piping portion 21a. Stress applied on the first heat receiving plate 30a occurs along a width direction of a gap between the substrates of the reflective liquid crystal panel 60B. Therefore, an optical path length of light incident on the reflective liquid crystal panel 60B changes, and image quality can degrade. Further, because the piping portion 21a deflects in a given direction, a damper effect of the piping portion 21a is limited. Therefore, as illustrated in FIG. 8, the piping portion 21a becomes less likely to exert elasticity in directions other than the deflecting direction, so that vibration of the piping portion 21a becomes more likely to be transmitted to the first heat receiving plate 30a.

As illustrated in FIG. 9, at the portion 50B where the piping portion 21a is connected to the supporting portion 10, in the case where the piping portion 21a deflects to the side opposite to the side on which the reflective liquid crystal panel 60B is disposed, the portion 50A where the piping portion 21a is connected to the first heat receiving plate 30a is pushed downward in FIG. 9 by reaction force with respect to the deflection of the piping portion 21a. Stress applied on the first heat receiving plate 30a occurs along the width direction of a gap between the substrates of the reflective liquid crystal panel 60B. Therefore, an optical path length of light incident on the reflective liquid crystal panel 60B changes, and image quality can degrade. Further, because the piping portion 21a deflects in a given direction, a damper effect of the piping portion 21a is limited. Therefore, as illustrated in FIG. 10, the piping portion 21a becomes less likely to exert elasticity in directions other than the deflecting direction, so that vibration of the piping portion 21a becomes more likely to be transmitted to the first heat receiving plate 30a.

Figure 11:
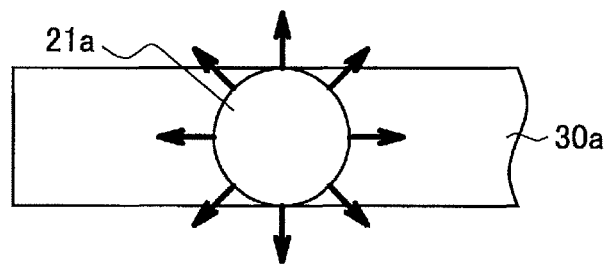
FIG. 11 is an explanatory diagram illustrating elasticity of the cooling pipe.

In contrast to this, at the projector 100 according to the present embodiment, as a result of the damper effect of the piping portion 21a being appropriately exerted, stress applied on the first heat receiving plate 30a is reduced. FIG. 11 is an explanatory diagram of the piping portion 21a (coolant tube 21) and the first heat receiving plate 30a seen from the piping portion 21a side along the shaft direction of the piping portion 21a. At the projector 100 according to the present embodiment, the piping portion 21a is linearly disposed along a direction in which the plane of the first heat receiving plate 30a is disposed without being deflected, and reaction force with respect to the deflection does not occur at the coolant tube 21. Therefore, even if an impact or vibration is provided to the piping portion 21a, the piping portion 21a becomes more likely to exert elasticity in any direction on the outer periphery side. Therefore, at the portion 50A where the piping portion 21a is connected to the first heat receiving plate 30a, an impact or vibration occurring at the piping portion 21a is absorbed by the damper effect of the piping portion 21a and becomes less likely to be transmitted to the first heat receiving plate 30a.

In a similar manner, at the portion 50B where the piping portion 21a is connected to the supporting portion 10, because the piping portion 21a becomes more likely to exert elasticity in any direction on the outer periphery side, even if an impact or vibration is provided to the supporting portion 10, the impact or vibration is absorbed by the damper effect of the piping portion 21a and becomes less likely to be transmitted to the first heat receiving plate 30a. Further, at the projector 100 according to the present embodiment, the supporting portion 10 which supports part of the coolant tube 21 includes a resin material. Therefore, in the case where an impact or vibration is provided to the projector 100, the impact or vibration can be reduced also by elastomeric force of the supporting portion 10. Therefore, mechanical stress occurring with respect to the reflective liquid crystal panel 60B due to stress applied on the first heat receiving plate 30a from the piping portion 21a is reduced.

Also in a connection structure of the first heat receiving plate 30a and the piping portion 23a, stress to be applied on the first heat receiving plate 30a is reduced by similar action, and mechanical stress occurring with respect to the reflective liquid crystal panel 60B is reduced. Further, also in a connection structure of the second heat receiving plate 30b and the piping portions 23b and 25a, and a connection structure of the third heat receiving plate 30c and the piping portions 25b and 27a, stress to be applied on the second heat receiving plate 30b and the third heat receiving plate 30c is reduced by similar action, and mechanical stress occurring with respect to the reflective liquid crystal panel 60G and the reflective liquid crystal panel 60R is reduced.

As described above, at the projector 100 according to the present embodiment, as a coolant tube connected to the heat receiving plate 30 which receives heat released by the reflective liquid crystal panel 60, a coolant tube having flexibility is used. Further, the coolant tube is supported by the supporting portion 10. Therefore, stress to be applied on the heat receiving plate 30 by the own weight of the coolant tube is reduced, and direct transmission of an impact or vibration to be provided to the projector 100 to the heat receiving plate 30 via the coolant tube is suppressed by the damper effect of the coolant tube.

Further, at such a projector 100, the coolant tube is disposed along a direction in which the plane of the heat receiving plate 30 is disposed without being deflected. Therefore, reaction force with respect to the deflection of the coolant tube does not occur, and stress to be applied on the heat receiving plate 30 is reduced. Further, as a result of the coolant tube being disposed along the direction in which the plane of the heat receiving plate 30 is disposed without being deflected, it is possible to exert elasticity in any direction on the outer periphery side of the cooling pipe. Therefore, even in the case where an impact or vibration is provided to the projector 100, stress to be applied on the heat receiving plate 30 is reduced by the damper effect of the cooling pipe.

Further, the direction in which the coolant tube is disposed is a direction along a substrate surface of the reflective liquid crystal panel 60, and is orthogonal to a width direction of a gap between the substrates. Therefore, application of stress along the width direction of the gap between the substrates of the reflective liquid crystal panel 60 to the heat receiving plate 30 by a supply pressure of the coolant tube is suppressed.

Further, at such a projector 100, the supporting portion 10 which supports the coolant tube includes a resin material, and, when an impact or vibration is provided to the projector 100, elasticity is exerted. Therefore, stress to be applied on the heat receiving plate 30 is reduced also by the damper effect of the supporting portion 10.

In this manner, as a result of stress to be applied on the heat receiving plate 30 being suppressed, mechanical stress on the reflective liquid crystal panel 60 is reduced. Therefore, it is possible to suppress degradation of image quality of an enlarged and displayed image.

Further, the supporting portion 10 which supports the coolant tube is included in part of the bulkhead of the dust-proof space S which houses the reflective liquid crystal panel 60 and the heat receiving plate 30 inside. Then, the coolant tube is derived outside of the dust-proof space S via the supporting portion 10, and the radiator 82 as the heat releasing unit is disposed outside the dust-proof space S. Therefore, a heat amount inside the dust-proof space S is reduced, and cooling efficiency of the reflective liquid crystal panel 60 is improved while dust resistance inside the dust-proof space S is ensured.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, while, in the above-described embodiment, the projector 100 includes the reflective liquid crystal panel 60 as an optical panel, the present technology is not limited to such an example. For example, the optical panel may be a transmissive liquid crystal panel or other optical panels.

Further, while, in the above-described embodiment, a straight tube having flexibility is used as the cooling pipe, the present technology is not limited to such an example. The cooling pipe may partly have a curved portion or a bent portion. Also with such a coolant tube, at least at a portion where the coolant tube is connected to the heat receiving plate 30 and a portion where the coolant tube is connected to the supporting portion 10, as a result of the piping portions being disposed in parallel along the direction in which the plane of the heat receiving plate 30 is disposed, it is possible to provide an effect by the technology of the present disclosure.

Further, in the technology of the present disclosure, at least at the cooling pipe (piping portion) disposed between the heat receiving plate 30 and the supporting portion 10, at least at the portion where the cooling pipe is connected to the heat receiving plate 30 and the portion where the cooling pipe is connected to the supporting portion 10, it is only necessary that the piping portions be disposed in parallel along the direction in which the plane of the heat receiving plate 30 is disposed, and a configuration of a channel of the coolant on the supporting portion 10 or within the supporting portion 10 is not limited.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A projector including:
an optical panel;
a heat receiving plate including a coolant passage inside and configured to receive heat released by the optical panel;
a coolant tube having flexibility and connected to the heat receiving plate; and
a supporting portion to which the coolant tube extending from the heat receiving plate is connected,
in which the coolant tube is disposed along a direction in which a plane of the heat receiving plate is disposed at least at a portion where the coolant tube is connected to the heat receiving plate and a portion where the coolant tube is connected to the supporting portion.

(2)

The projector according to (1),
in which the direction in which the plane of the heat receiving plate is disposed matches a direction along a direction in which a substrate included in the optical panel is disposed.

(3)

The projector according to (1) or (2),
in which the portion where the coolant tube is connected to the heat receiving plate and the portion where the coolant tube is connected to the supporting portion are disposed on a same plane extending along the direction in which the plane of the heat receiving plate is disposed.

(4)

The projector according to any one of (1) to (3),
in which the coolant tube connected to the heat receiving plate includes an inflow side coolant tube through which a coolant flowing into the heat receiving plate flows and an outflow side coolant tube through which a coolant flowing out from the heat receiving plate flows.

(5)

The projector according to (4),
in which the inflow side coolant tube and the outflow side are disposed in parallel at a regular interval.

(6)

The projector according to any one of (1) to (5),
in which a plurality of heat receiving plates are provided so as to correspond to a plurality of the respective optical panels, the plurality of heat receiving plates are connected in series by the coolant tube, and the coolant tube which connects the one heat receiving plate to the other heat receiving plate has both ends connected to the one heat receiving plate and the other heat receiving plate, and a central portion supported by the supporting portion.

(7)

The projector according to any one of (1) to (6),
in which the supporting portion has a groove portion in which the coolant tube is disposed.

(8)

The projector according to any one of (1) to (7),
in which at the portion where the coolant tube is connected to the supporting portion, the coolant tube is fixed at the supporting portion with a fixing fixture and derived along the direction in which the plane of the heat receiving plate is disposed.

(9)

The projector according to any one of (1) to (8),
in which the supporting portion forms part of a bulkhead of dust-proof space which houses the optical panel inside.

(10)

The projector according to any one of (1) to (9),
in which the supporting portion includes a resin material.

REFERENCE SIGNS LIST 10 supporting portion
11a, 11b, 11c, 11d groove portion
17 guide portion
21, 23, 25, 27, 29a, 29b coolant tube
21a, 23a, 23b, 25a, 25b, 27a piping portion
30 heat receiving plate
40 fixing fixture
60 reflective liquid crystal panel (optical panel)
82 radiator
84 tank
86 pump
100 projector

The invention claimed is:
1. A projector comprising:
an optical panel;
a heat receiving plate including a coolant passage inside and configured to receive heat released by the optical panel;
a coolant tube having flexibility and connected to the heat receiving plate; and
a supporting portion to which the coolant tube extending from the heat receiving plate is connected, wherein
the coolant tube extends in a straight line in a plane of the heat receiving plate from a portion where the coolant tube is connected to the heat receiving plate to a portion where the coolant tube is connected to the supporting portion.

2. The projector according to claim 1,
wherein a direction of the straight line is parallel to a direction in which a substrate included in the optical panel is disposed.

3. The projector according to claim 1,
wherein the portion where the coolant tube is connected to the heat receiving plate and the portion where the coolant tube is connected to the supporting portion are disposed on a same plane extending along the plane of the heat receiving plate.

4. The projector according to claim 1,
wherein the coolant tube connected to the heat receiving plate includes an inflow side coolant tube through which a coolant flowing into the heat receiving plate flows and an outflow side coolant tube through which a coolant flowing out from the heat receiving plate flows.

5. The projector according to claim 4,
wherein the inflow side coolant tube and the outflow side coolant tube are disposed in parallel at a regular interval.

6. The projector according to claim 1,
wherein a plurality of heat receiving plates are provided so as to correspond to a plurality of respective optical panels, the plurality of heat receiving plates are connected in series by the coolant tube, and the coolant tube connects one heat receiving plate to another heat receiving plate has both ends connected to the one heat receiving plate and the another heat receiving plate, and a central portion supported by the supporting portion.

7. The projector according to claim 1,
wherein the supporting portion has a groove portion in which the coolant tube is disposed.

8. The projector according to claim 1,
wherein at the portion where the coolant tube is connected to the supporting portion, the coolant tube is fixed at the supporting portion with a fixing fixture and extends along the plane of the heat receiving plate.

9. The projector according to claim 1,
wherein the supporting portion forms part of a bulkhead of dust-proof space which houses the optical panel.

10. The projector according to claim 1,
wherein the supporting portion includes a resin material.

* * * * *